(12) United States Patent
Allen et al.

(10) Patent No.: US 7,000,161 B1
(45) Date of Patent: Feb. 14, 2006

(54) RECONFIGURABLE PROGRAMMABLE LOGIC SYSTEM WITH CONFIGURATION RECOVERY MODE

(75) Inventors: Tim Allen, Santa Cruz, CA (US); Michael Fairman, Santa Cruz, CA (US); Mario Guzman, San Jose, CA (US); Bryan Hoyer, Boulder Creek, CA (US); Chris Lane, San Jose, CA (US); Kerry Veenstra, San Jose, CA (US); Keith Duwel, San Jose, CA (US); Andy L. Lee, San Jose, CA (US)

(73) Assignee: Altera Corporation, San Jose, CA (US)

( * ) Notice: Subject to any disclaimer, the term of this patent is extended or adjusted under 35 U.S.C. 154(b) by 469 days.

(21) Appl. No.: 10/270,800

(22) Filed: Oct. 11, 2002

Related U.S. Application Data

(60) Provisional application No. 60/329,491, filed on Oct. 15, 2001.

(51) Int. Cl.
*G01R 31/28* (2006.01)
(52) U.S. Cl. .................................... 714/725
(58) Field of Classification Search ............... 714/42, 714/48, 51, 52, 54, 723–725, 734, 738, 814; 326/23, 40, 41, 46, 189.04, 230.08
See application file for complete search history.

(56) References Cited

U.S. PATENT DOCUMENTS 5,542,051 A * 7/1996 Sugita et al. ................. 714/51

6,097,211 A * 8/2000 Couts-Martin et al. ....... 326/40
6,209,000 B1 * 3/2001 Klein et al. .................. 707/203
6,631,487 B1 * 10/2003 Abramovici et al. ........ 714/725

OTHER PUBLICATIONS

Westfeldt, W.(Xilinx, Inc.), "Silicon Xpresso and Internet Reconfigurable Logic," *Xcell: The Quarterly Journal for Programmable Logic Users*, Issue 32, Second Quarter 1999, pp. 10-12.

* cited by examiner

*Primary Examiner*—Albert Decady
*Assistant Examiner*—John J. Tabone, Jr.
(74) *Attorney, Agent, or Firm*—Fish & Neave IP Group of Ropes & Gray LLP; Jeffrey H. Ingerman

(57) ABSTRACT

A programmable logic system includes a reconfigurable programmable logic device and configuration storage that stores at least two configurations. A default configuration loads first and then loads the desired user application configuration. If the user application configuration fails, the system saves data regarding the failure and then returns to the default configuration for recovery. The default configuration, after reading the failure data, causes an operator to be called to intervene, or loads a different (e.g., previous) configuration if one is available in configuration storage. The system is particularly useful where the user can update configurations remotely. In an alternative mode, the system stores only the user configuration (which is loaded first) and the default configuration. If a newly-loaded configuration fails, the default configuration is loaded and signals the operator or takes other action short of loading a different configuration.

58 Claims, 6 Drawing Sheets

RECONFIGURABLE PROGRAMMABLE LOGIC SYSTEM WITH CONFIGURATION RECOVERY MODE

CROSS REFERENCE TO RELATED APPLICATION

This claims the benefit of copending, commonly-assigned U.S. Provisional Patent Application No. 60/329,491, filed Oct. 15, 2001.

BACKGROUND OF THE INVENTION

This invention relates to a programmable logic system including a programmable logic device and configuration storage device capable of storing a plurality of configurations and receiving updated configurations from an external source. More particularly, this invention relates to such a device in which the programmable logic device includes configuration circuitry for loading one of the plurality of configurations and for recovering from a configuration failure.

Early programmable logic devices were one-time configurable. For example, configuration may have been achieved by "blowing"—i.e., opening—fusible links. Alternatively, the configuration may have been stored in a programmable read-only memory. Later, programmable logic devices incorporating erasable programmable read-only memory (EPROM) for configuration became available. These devices could be reconfigured.

Still later, programmable logic devices incorporating static random access memory (SRAM) for configuration became available. These devices, which also can be reconfigured, store their configuration in a nonvolatile memory such as an EPROM, from which the configuration is loaded when the device is powered up. Such devices typically include the circuitry necessary to load the configuration from the nonvolatile storage.

More recently, programmable logic devices have been provided that have the ability to have their configurations updated remotely. For example, one such device is described in copending, commonly-assigned U.S. patent application Ser. No. 09/879,303, filed Jun. 12, 2001, now U.S. Pat. No. 6,738,962, which is hereby incorporated by reference in its entirety. Such devices have the circuitry needed to receive new configuration data, which are written into the nonvolatile memory to be used in place of the prior configuration.

In such a device, the prior configuration generally is not preserved at all once the new configuration begins loading. This is, at least in part, because if any portion of the old configuration were to remain active as the new configuration began to become active, the new configuration would form connections that might, depending on the specifics of the old configuration, create short circuits in view of connections formed by the portion of the old configuration that is still active. Such short circuits could generate heat that might damage or destroy the device. To prevent such damage, the old configuration generally is erased prior to loading of the new configuration.

As a result, if the new configuration is defective, the device may become useless, because the old configuration will have been deleted and the new configuration will not load. One solution is to provide external programming circuitry that can reload the old configuration or a different new configuration. However, in newer programmable logic devices, which have the capability to be configured as microprocessors (so-called "soft processors"), the programming circuitry may be part of the configuration. Once the device has been rendered inoperative by a bad configuration, it may not be possible in the field to reconfigure the soft processor configuration needed to load a working configuration.

While the device could be reconfigured by a technician or operator, in many applications, a technician may not be present, and it may be difficult or expensive to dispatch a technician. For example, the programmable logic device may be in a geographically remote location, such as a cellular communication tower on a remote hilltop, in which case it will be time-consuming and expensive to dispatch a technician, and all the while the cellular communication facility will be inoperative, causing further economic loss. Similarly, the programmable logic device may be part of a consumer electronic product that the user is permitted to reconfigure by a downloadable upgrade. If the reconfiguration fails, either a technician will have to be sent to the user's location or the user will have to send the product back to the manufacturer. Either way, there are costs involved and the user will be without a working product for an extended period.

For these reasons, it would be desirable to be able to provide a remotely reconfigurable programmable logic device having a configuration recovery mode, so that if a reconfiguration attempt fails, the device does not become completely inoperative.

SUMMARY OF THE INVENTION

It is an advantage of the present invention that it provides a remotely reconfigurable programmable logic device having a configuration recovery mode, so that if a reconfiguration attempt fails, the device does not become completely inoperative.

This and other advantages of the invention are accomplished in accordance with the principles of the invention by providing a programmable logic system including a programmable logic device adapted to be configured by loading a stored configuration, and a configuration storage device adapted to store a plurality of configurations. A first one of the plurality of configurations is a default configuration. At least one different one of the configurations is a user application configuration. The configurations, including the default configuration, stored in the configuration storage device preferably are stored there by the user when the user programs the programmable logic system.

The programmable logic system includes configuration circuitry that initiates loading of one of the plurality of configurations from the configuration storage device. On occurrence of a configuration failure during or after loading of that one of the plurality of configurations, the configuration circuitry initiates a recovery loading of the default configuration.

BRIEF DESCRIPTION OF THE DRAWINGS

The above and other advantages of the invention will be more apparent upon consideration of the following detailed description, taken in conjunction with the accompanying drawings, in which like reference characters refer to like parts throughout, and in which.

DETAILED DESCRIPTION OF THE INVENTION

Figure 1:
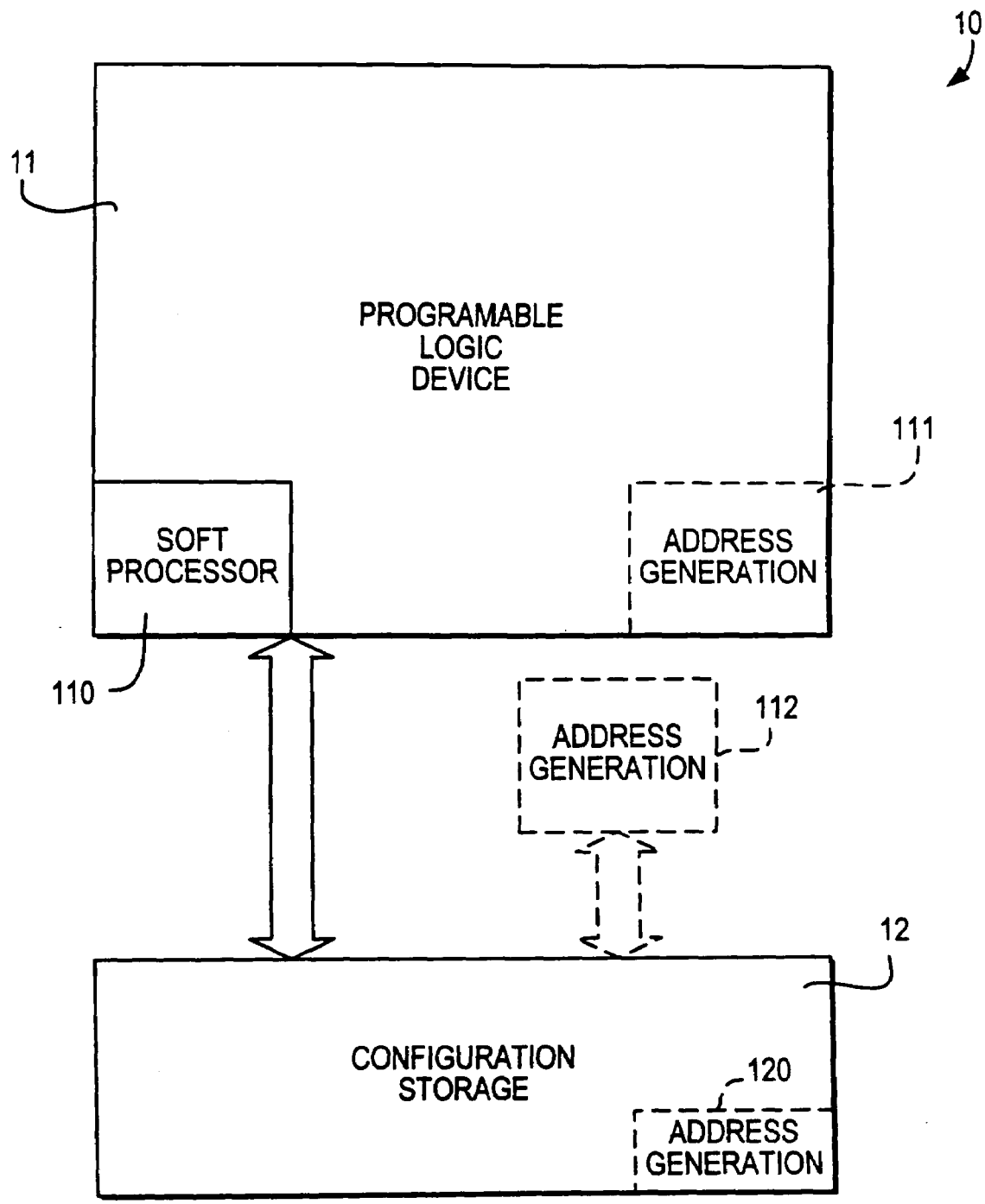
FIG. 1 is a schematic representation of an embodiment of a programmable logic system according to the present invention.

The present invention avoids some of the difficulties involved when remote reconfiguration of a programmable logic device is allowed by providing a configuration recovery mode. In previously-known devices, if storage of a new configuration into the device's configuration storage were begun, the former configuration would immediately be completely erased from the configuration storage. The device would continue to function because the configuration will already have been loaded, and assuming all went well, the device would load the new configuration on the occurrence of the next power-up. However, as discussed above, if the storage of the new configuration were interrupted in any way, such as by a power or communications failure, then at the next power-up the device would experience a configuration failure because it would not have a complete configuration to load.

A configuration failure is one type of reconfiguration condition. Other types of reconfiguration conditions could occur. The configuration file could have been corrupted during its transmission to the configuration storage, so that it fails a cyclic redundancy check (CRC). This would be a configuration failure.

Alternatively, the configuration file could be perfectly intact, but could be written for a different type of programmable logic device, which could be detected by the programmable logic device. Although this type of reconfiguration condition is an exception condition, it is not a configuration failure.

Similarly, the configuration file could be for the correct type of programmable logic device, but could be for a different application of the programmable logic device. For example, the same programmable logic device might be used in a cellular telephone cell site and in a handheld Global Positioning System (GPS) receiver. If the cell site were inadvertently sent the configuration file for a GPS receiver, then on start-up, when the programmable logic device is configured as a GPS receiver and checks its environment to make sure it has access to radio receivers and other necessary devices, it will recognize an exception condition and generate a reconfiguration condition.

The new configuration may even begin to operate normally and generate a reconfiguration condition only later because of an error that does not manifest itself until a particular circumstance arises. This latter type of failure, which could occur hours, days or weeks later (or even later than that) is just as much a configuration update problem as the failure that occurs immediately.

It is useful to consider different types of reconfiguration conditions. Some reconfiguration conditions, such as those just described, whether or not considered "failures," are exception conditions that require special handling on reconfiguration. Other reconfiguration conditions, such as a power-on reset or a manual reset, are not exception conditions and do not require special handling.

The present invention overcomes these difficulties associated with the remote updating of programmable logic configurations by providing a programmable logic system including a programmable logic device and a configuration storage that stores a plurality of configurations. In particular, the configuration storage preferably stores at least a default configuration and a primary user application configuration.

The primary user application configuration is the configuration defined by the user for the intended functioning of the system, while the default or "factory" configuration is a configuration, also defined by the user, that may control how the system reacts on power-up or on a configuration failure. (While the default configuration may be referred to as the "factory" configuration, that reference is to the user's "factory," where the user initially programs the programmable logic device and system, and not the factory of the manufacturer of the "blank" programmable logic device.) The configuration storage may also store additional user application configurations beyond the primary configuration. For example, in an n-page configuration storage, there may be one default configuration and n-1 user application configurations, of which one is the primary configuration. As discussed below, the other—i.e., non-primary—user application configurations may be previous versions of the user application configuration, to which the system can be "rolled back" in the event of a configuration failure.

The programmable logic system of the invention preferably can operate in either of two modes. In a so-called "remote update mode," whenever the system is powered up, the default configuration is loaded. Whenever the default configuration is loaded, it in turn loads the primary user application configuration unless there is an indication that the default configuration has been loaded because of an exception condition relative to the primary (or other) user application configuration. If the default configuration determines, in the manner described below, that it has been loaded not because of a power-up or manual reset condition, but because of an exception condition, then instead of loading again the configuration under which the exception arose, which would sooner or later lead back to the same exception condition, it follows its built-in recovery procedures. Those recovery procedures could include loading one of the earlier user application configurations (preferably the next-most-recent configuration, or more particularly, the next-most-recent configuration that has not resulted in an exception condition), if available, which would put the system back into a known working condition. The recovery procedures could also include issuing a request for operator intervention, depending on the nature of the failure.

In a so-called "local update mode," the system on power-up or manual reset defaults to the primary user application configuration, and only after an exception condition (indicated, again, as described below) loads the "default" configuration which executes the recovery procedures described above.

If an exception condition is detected, then in either mode an exception state is entered and indicated in an appropriate register or other storage, so that on next power-up or manual reset, appropriate action can be taken. Thus, in the remote update mode, the default configuration would check the exception register first. If no exception state were indicated, the default configuration would "assume" that it was loaded as a result of power-up or a manual reset, and would load the primary user application configuration. In the local update mode, the exception register would be checked by the default configuration, which is loaded after a detectable failure of the primary user application configuration (such as a CRC failure), to initiate recovery procedures.

The main difference between the remote update mode and the local update mode is the way that an exception state is recognized. In both modes, some exceptions can be recognized by the system itself, such as a problem with the integrity of the configuration itself (e.g., CRC failure). However, if the error occurs because of an internal soft error in the configuration (e.g., a properly compiled configuration for an inappropriate environment as in the cell site vs. GPS example above), then in local update mode the system might simply hang. However, in remote update mode, the default configuration preferably is designed to launch a "watchdog timer" prior to loading the user application configuration. The watchdog timer process, which should be designed to survive the loading of the user application configuration, preferably also will be designed to wait for a signal from the user application configuration that it has loaded successfully. If it does not receive such a signal (e.g., because the system hangs), the watchdog timer sets an exception state and initiates reconfiguration of the system. It is up to the user to design the default configuration to launch the watchdog timer and to design the user application configuration to signal the watchdog timer. It is further preferable that the system be constructed in such a way that denies a user application configuration control over the watchdog timer, thereby preventing the user from—intentionally or unintentionally—disabling the watchdog timer. More preferably, the watchdog timer should run continually, and the user application configuration should repeatedly signal the watchdog timer, rather than signalling only once on successful loading, so that a later-occurring error or failure that is not detected by the configuration itself can be detected by the watchdog timer.

Because in remote update mode the system, by virtue of the watchdog timer, can detect an exception condition even when the configuration cannot load, remote update mode can be considered more robust than local update mode. Indeed, the designation "remote update mode" is used because it is the mode that is less likely to result in the need for operator intervention, and therefore more suitable for use when the system is located in a location that is difficult to reach (such as a cellular telephone cell site on a remote hilltop). Local update mode is more likely to result in a hung system, and therefore is more likely to be used where an operator is on the premises (hence, "local"), or where the risk (or consequence) of an exception condition is low, and the speed advantage of immediate loading of the application configuration is deemed more important.

The invention will now be described with reference to FIGS. 1–6.

As seen in FIG. 1, a programmable logic system 10 in accordance with the present invention preferably includes two components—programmable logic device 11 and configuration storage device 12. Programmable logic device 11 is preferably a programmable logic device from the STRATIX™ family of devices-available from Altera Corporation, of San Jose, Calif., or a similar device.

Configuration storage device 12 is preferably a memory device having sufficient capacity to store at least two configurations of device 11—i.e., a default configuration and one user application configuration. The precise capacity required for device 12 will depend on the particular programmable logic device 11 being used and the size of its configuration. However, a typical configuration has a size on the order of 500 kilobytes, and therefore device 12 should have a memory capacity of at least one megabyte so that it can store two configurations. Preferably, device 12 should be able to store at least three configurations, so that the default configuration, as part of its recovery procedures, can "roll back" programmable logic system 10 to an older user application configuration if necessary. In one embodiment, configuration storage device 12 can store eight configurations, including one default configuration and seven user application configurations.

The particular memory technology used in configuration storage device 12 can be any technology in which particular pages can be addressed by a soft processor 110 in programmable logic device 11, so that a desired configuration can be loaded by page address. In particular, either industry-standard Flash memory or a configuration memory device with built-in address generation 120—such as, e.g., a member of the EPC series of configuration memories available from Altera Corporation—can be used. A configuration memory with built-in address generation preferably will support paging with dedicated pins, while paging can be implemented in Flash memory by using the highest-order address pins as page pins. Thus, to support eight pages in a Flash memory implementation, the three highest-order address pins preferably would be used as page pins. Other pins could be used, but the addressing is simplest if the highest-order pins are used.

If Flash memory is used instead of a configuration memory with address generation as configuration storage device 12, more address pins may be required. In addition, address generation will have to be provided outside configuration storage device 12—either in programmable logic device 11 at 111 or in a device 112 external to both programmable logic device 11 and configuration storage device 12.

Configuration storage device 12 preferably is programmed using the ISC protocol over the JTAG standard if configuration storage device 12 is designed for use with the JTAG standard, such as where configuration storage device 12 is one of the aforementioned EPC-series memories. Otherwise, such as where configuration storage device 12 is Flash memory, in most cases there will be other devices in programmable logic system 10 that are JTAG-compliant and that communicate with configuration storage device 12, and configuration storage device 12 can be programmed by relaying the programming data through such other devices. The latter method is slower than communicating directly with configuration storage device 12, and therefore a JTAG-compliant configuration storage device 12 is preferable.

Preferably, the default configuration is always stored at Page 000 of configuration storage device 12, while the primary user application configuration preferably is always stored at Page 001 of configuration storage device 12. If there is additional capacity in configuration storage device 12 for storing other configurations, each page preferably stores the configuration that is next-most-recent as compared to the configuration stored in the previous page. However, it is also possible to store the user application configurations—i.e., the configurations other than the default configurations—in random page locations in device 12, but with indicia (e.g., serial numbers or time stamps) to identify which is most recent, next-most-recent, etc. In the former case, in order to roll back to the next-most-recent configuration, the recovery procedure of the default configuration would simply load the configuration from the page address one higher than the page address of the configuration that generated the exception. In the latter case, the recovery procedure would have to examine the time stamps of the configuration that generated the exception and all other configurations to decide which is the next-most-recent configuration.

If system 10 has no remote or local update mode, then the appropriate page of configuration storage 12 is selected by user input on power-up, so that the correct configuration can be loaded. However, if remote and/or local update mode is enabled, then the update control circuitry has control of those inputs to select the configuration to load.

Figure 2:
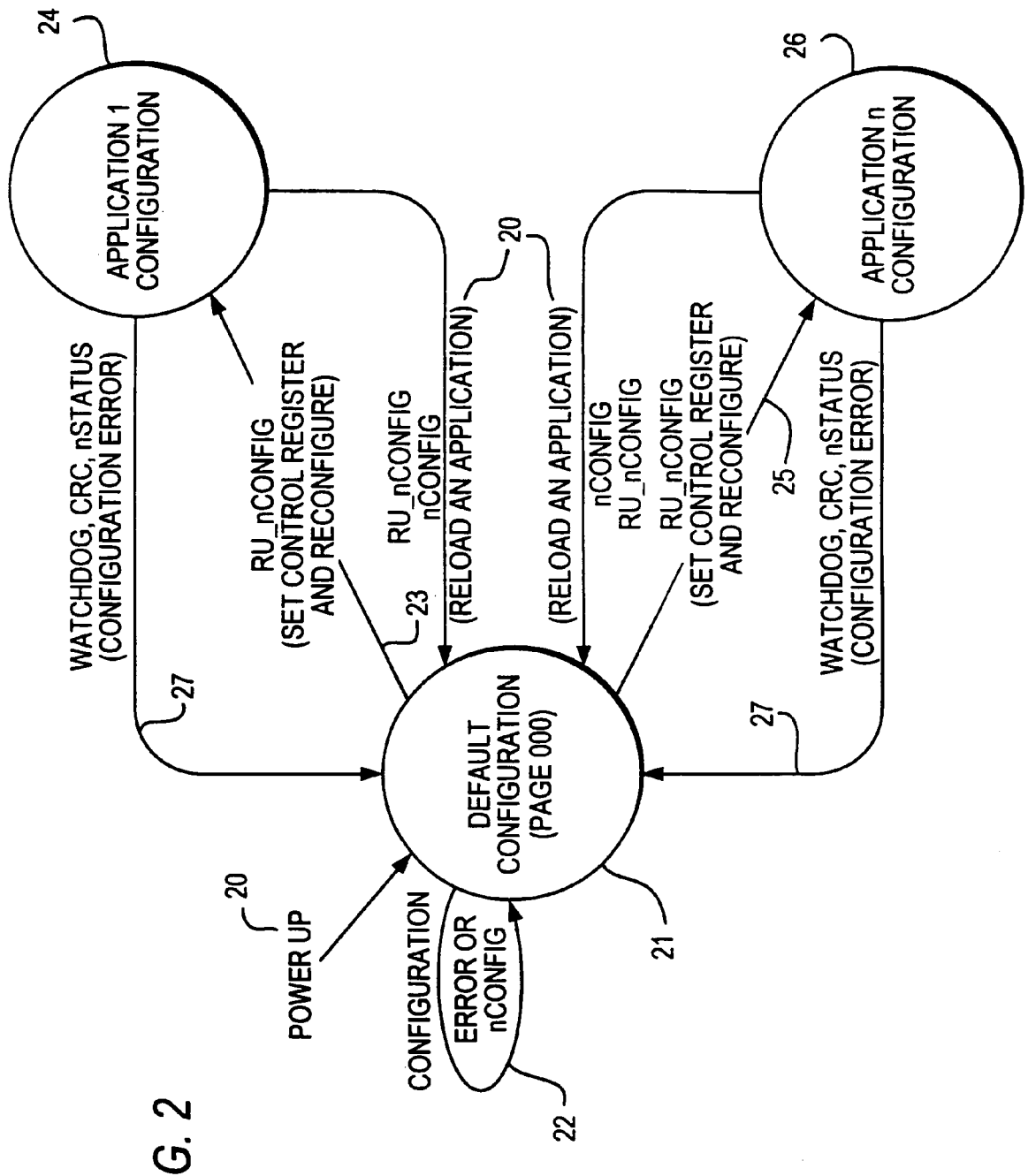
FIG. 2 is a state diagram showing a preferred embodiment of the transitions between configurations in remote update mode in a programmable logic system according to the present invention.

A preferred method of operating programmable logic system 10 in remote update mode is diagramed in FIG. 2. Note that the various signals discussed are explained in more detail in connection withe FIGS. 4 and 5, below.

On power-up at 20, system 10 preferably initializes to a state 21 in which the default configuration has been loaded (preferably from Page 000 of configuration storage device 12). If, as at 22, any exception condition (e.g., a CRC or watchdog failure or an nSTATUS signal) occurs while system 10 is in state 21, or on receipt of a user configuration signal (assertion low of the signal nCONFIG), system 10 preferably remains in state 21. In such a case, user intervention probably would be necessary. After powering up in state 21, system 10 preferably will load, at 23, a user application configuration 24 (preferably from Page 001 of configuration storage 12) according to the instructions in the default configuration and the status registers, as discussed below. If while system 10 is in state 21, the signal RU_nCONFIG (i.e., remote update configure on low) is asserted low under the control of the default configuration, then system 10 either would load a new primary user configuration (again preferably from Page 001 of configuration storage 12, after an update has been loaded) at 23, entering state 24, or would load one of the older user application configurations (preferably from Page n, n≧2, of configuration storage 12) at 25, entering state 26. The choice of which user application configuration to load on low assertion of RU_nCONFIG is based on data in the appropriate registers, as discussed below, and on instructions coded into default configuration 21.

If at 27 nCONFIG or RU_nCONFIG is asserted low when system 10 is in state 24 or state 26, that signifies an instruction to reconfigure. A signal indicating configuration error, such as a watchdog timeout, CRC failure or nSTATUS signal also could be asserted at 27. Data regarding the error preferably will be written into the appropriate registers and system 10 will load the default configuration, returning to state 21, so that recovery procedures can be initiated by the default configuration based on its instructions and the data in the appropriate registers. This may involve rolling back to a previous configuration now stored at Page 002 (or elsewhere).

Figure 3:
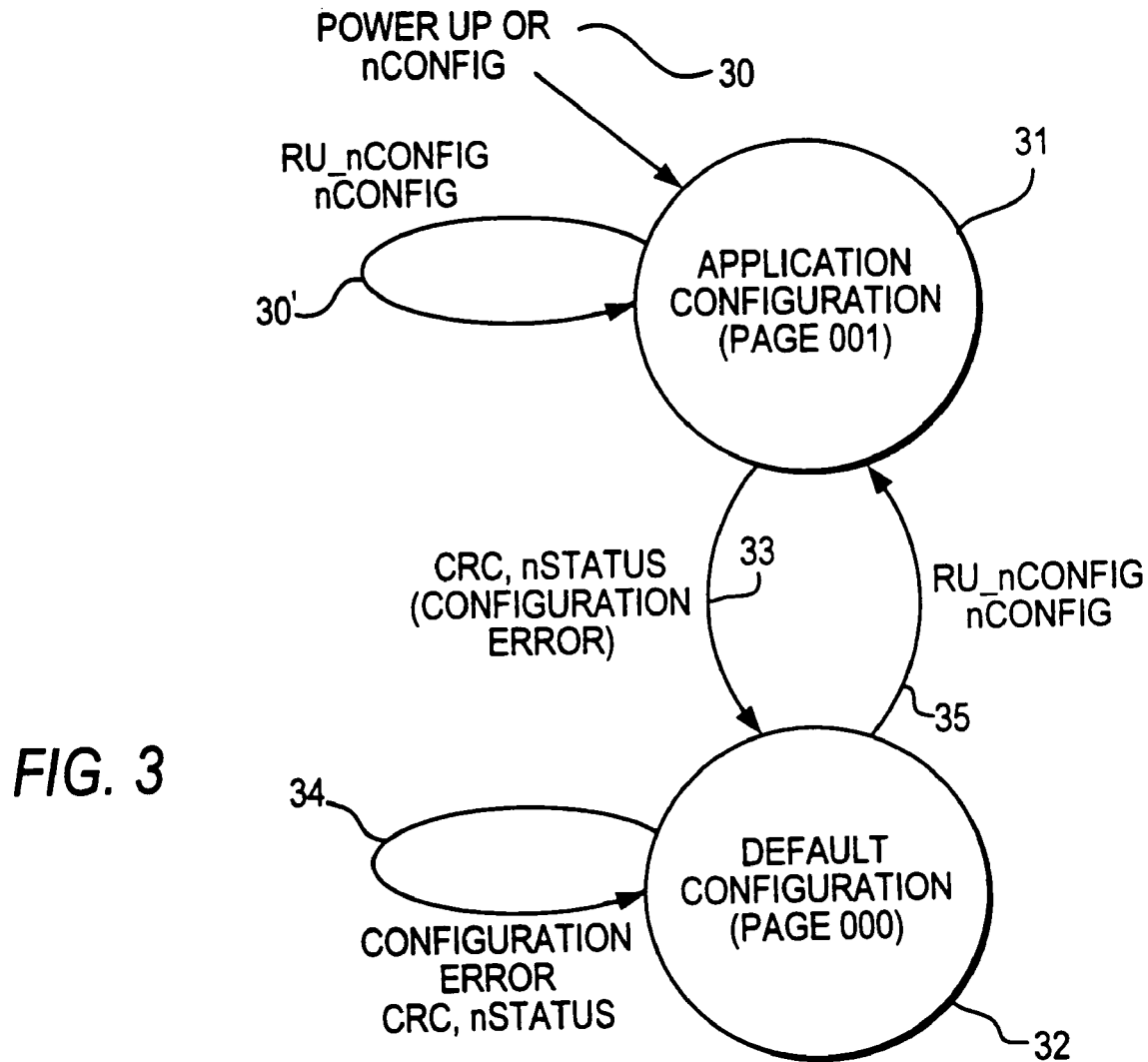
FIG. 3 is a state diagram showing a preferred embodiment of the transitions between configurations in local update mode in a programmable logic system according to the present invention.

A preferred method of operating programmable logic system 10 in local update mode is diagramed in FIG. 3. Although this mode is referred to as "local" update mode for the reasons described above, any actual update could be accomplished locally or remotely. In this mode, the system can be in one of two states—a state 31 in which a user application configuration is loaded, or a state 32 in which a default configuration is loaded.

On power-up or receipt of a configuration signal (assertion low of the signal nCONFIG), at 30, system 10 preferably loads the user application configuration at Page 001 of configuration storage 12, entering state 31. In this mode, only the Page 001 configuration and the Page 000 default configuration are used. If there are other configurations stored in configuration storage 12, they are ignored. If while system 10 is in state 31 it again receives a configuration signal (at 30'), it again loads the user application configuration from Page 001. This could be a reload, for some reason, of the same configuration that had been loaded, or could be an initial load of a configuration that had been newly stored in configuration storage 12 as a replacement for the then-current configuration.

If, while system 10 is in state 31, a signal signifying a configuration error is asserted low (at 33), system 10 preferably will enter state 32, loading the default configuration at Page 000 of configuration storage 12. If at 34 there is an error (while system 10 is already in state 32), the default configuration will be loaded again. Because there is no watchdog timer in local update mode, the configuration error that triggers the error signal is one that can be detected by system 10 operating under the newly-loaded user application configuration. For example, system 10 could have determined that the configuration was for a different type of programmable logic device or a different environment, as discussed above. However, if the defect in the configuration is such that it will not even load, then system 10 may simply hang, unless configuration storage device 12 is provided with a timer (more basic than the watchdog timer) that times out if configuration loading is not completed within a certain period after it begins.

Because only one user application configuration is permitted in local update mode, the default configuration cannot execute a rollback to an older user application configuration. Therefore, the range of options available to the default configuration is small, and is essentially limited to trying again to load the user application configuration, or signalling for operator intervention. If at 35 RU_nCONFIG is asserted low while the default configuration is loaded (or if a user deliberately initiates a reconfiguration—e.g., using nCONFIG), system 10 will again load the user application configuration. If the reason that system 10 had loaded the default configuration in the first instance was a failure caused by a defect in the user application configuration, system 10 will soon return to state 32 once again, as that failure occurs again and again triggers loading of the default configuration.

It is clear that, as explained above, local update mode is less robust than remote update mode, and will more frequently result in a system that requires user intervention, either because the system hangs or because it requests intervention. For this reason, local update mode preferably is only used where system 10 is attended, or where the speed advantage of immediate loading of the user configuration outweighs the risk of configuration error, particularly if it is expected that there will not be frequent configuration updates.

Figure 4:
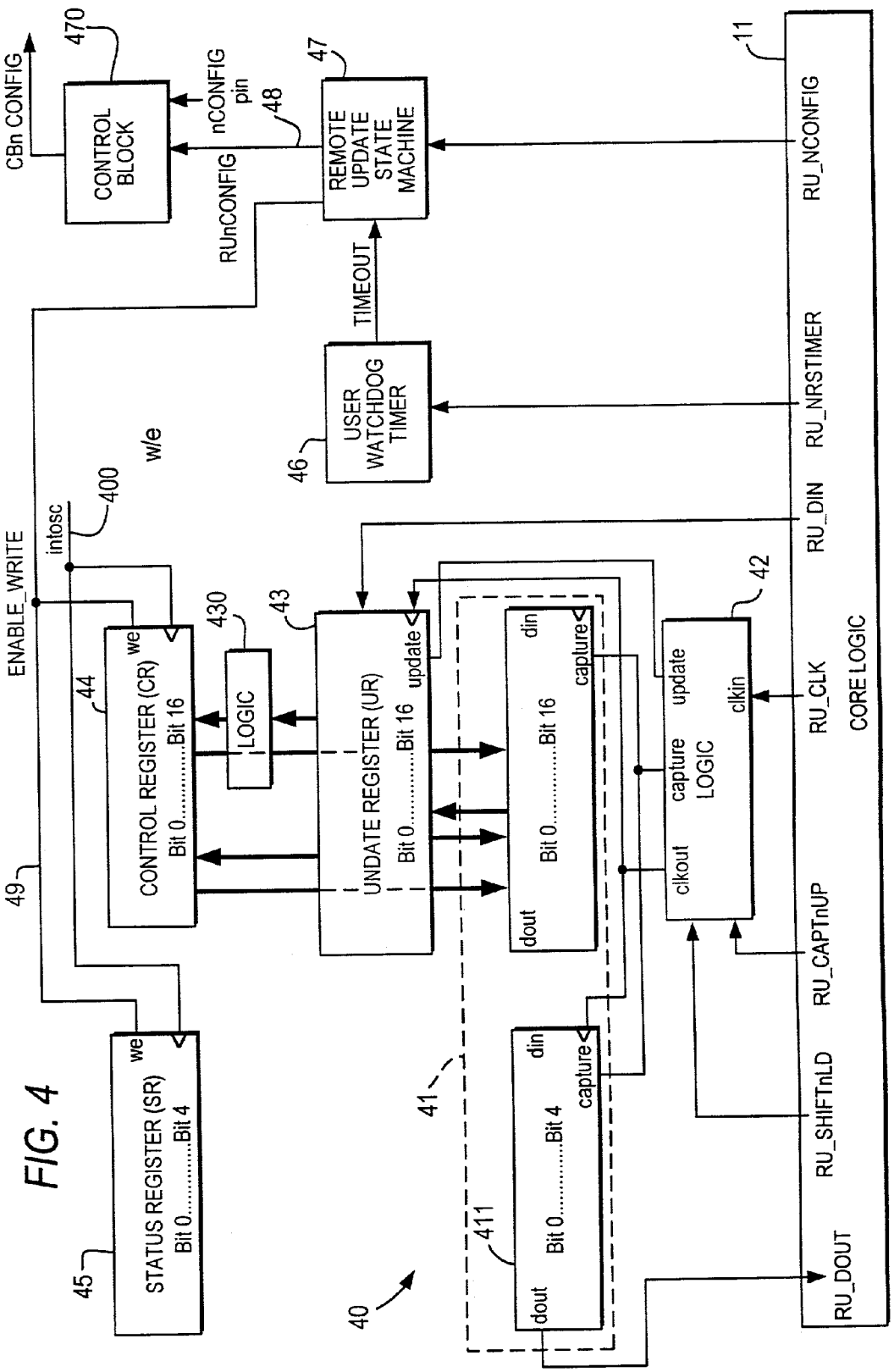
FIG. 4 is schematic representation of a preferred embodiment of control circuitry for updating a programmable logic system of the present invention.

A preferred embodiment of circuitry 40 for controlling the update processes in a system 10 according to the present invention is shown in FIG. 4, and shows the signal paths for the signals RU_DOUT, RU_SHIFTnLD, RU_CAPTnUPDT, RU_CLK, RU_DIN, RU_nRSTIMER and RU_nCONFIG between the core logic of programmable logic device 11 and circuitry 40.

Circuitry 40 includes a shift register 41 that receives data from the core logic via the RU_DIN (remote update data in)

signal and transmits data to the core logic via the RU_DOUT (remote update data out) signal. Shift register 41 preferably is twenty-two bits wide, with seventeen bits in a first portion 410 and five bits in a second portion 411. Circuitry 40 also includes capture/update logic 42 that receives signals RU_SHIFTnLD, RU_CAPTnUPDT and RU_CLK from the core logic and outputs (1) a clock signal (CLKOUT) to shift register 41 and to an update register 43 which preferably is in parallel with first portion 410 of shift register 41, (2) a capture control signal CAPTURE to shift register 41, and (3) and UPDATE signal to update register 43.

Circuitry 40 further includes (1) a control register 44 preferably in parallel with (a) first portion 410 of shift register 41, and (b) update register 43, and (2) a status register 45 in parallel with second portion 411 of shift register 41. Update/control logic 430 is interposed between update register 43 and control register 44, and allowing Remote Update State Machine (RUSM) 47 (see below) and control block 470 to control control register 44 and status register 45.

Both control register 44, which preferably is seventeen bits wide, and status register 45, which preferably is five bits wide, are clocked by the internal oscillator INTOSC 400 of device 11, which preferably runs at about 10 MHZ, and preferably both registers 44 and 45 are controlled by the same write enable signal 49 generated by the ENABLE_WRITE state 54 (FIG. 5) described below.

Circuitry 40 includes further a user watchdog timer 46 of any suitable structure as is well known, and reconfiguration detection logic 47. Watchdog timer 46 preferably is a 29-bit timer, of which the user can program the twelve highest-order bits of the start count, via the user application configuration. This gives timer 46 a granularity of $2^{17}$ cycles. Timer 46 is reset by signal RU_nRSTIMER being asserted low. The user preferably is instructed to have the user application configuration assert this signal low before timer 46 times out. If timer 46 does time out, it will signal RUSM 47. The user preferably also is instructed to have the user application configuration assert low the signal RU_nCONFIG when it is desired to change to a different configuration, which also signals RUSM 47. RUSM 47 preferably outputs at 48 a signal RUnCONFIG (different from RU_nCONFIG) to control block 470, which then calls configuration load processor 110. The RUnCONFIG signal is asserted low on the occurrence of any of the aforementioned reconfiguration sources. These include a watchdog timeout or assertion low of RU_nCONFIG by the user core logic 11.

Shift register 41 is accessible by the core logic of device 11 and allows the core logic to read and write update register 43 and control register 44, and to read status register 45+. Control register 44 contains the page address of the current configuration, the watchdog timer settings, and a datum (preferably a single bit) specifying whether the current configuration is a default configuration or a user application configuration. Update register 43 contains the same data as control register 44, but can be updated only by the default configuration which loads shift register 41 and then transfers the data from shift register 41 to update register 43. The default configuration can also capture the contents of update register 43 into shift register 41. Status register 45 preferably is written into by RUSM 47 prior to each reconfiguration to record the cause of the reconfiguration, so that the default configuration will know the cause and will be able to take appropriate action.

Shift register 41 is clocked by the signal RU_CLK. Shift register 41 shifts data on the rising edge of RU_CLK if RU_SHIFTnLD is "1". If RU_SHIFTnLD is "0" and RU_CAPTnUPDT is "0", shift register 41 will update update register 43 under control of capture/update logic 42. If RU_SHIFTnLD is "0" and RU_CAPTnUPDT is "1", shift register 41 will capture both (1) status register 45 and (2) update register 43 or control register 44, depending on whether the current configuration is a user application configuration or the default configuration, respectively. If RU_SHIFTnLD is "1", then RU_CAPTnUPDT has no function.

Specifically, if RU_SHIFTnLD is "0" and RU_CAPTnUPDT is "1", then shift register 41 will be written on the rising edge of RU_CLK with the contents of status register 45 and either update register 43 (in the default configuration) or control register 44 (in a user application configuration). If RU_SHIFTnLD is "0" and RU_CAPTnUPDT is "0", then update register 43 will be written on the rising edge of RU_CLK with the contents of shift register 41; this occurs in the default configuration only, and only in remote update mode.

Status register 45 is preferably five bits wide, with each bit preferably representing one of five possible causes for a reconfiguration, including, but not limited to, the type of failure, if any, of the previous configuration. The five reasons preferably represented by the five bits are (1) CRC failure, (2) the nSTATUS signal (indicating success or failure of configuration), (3) a core logic nCONFIG signal (i.e., RU_nCONFIG), (4) a pin-, i.e., user-, asserted nCONFIG signal, and (5) a watchdog timer timeout. At power-up, each of these bits preferably is "0", indicating that none of these conditions has occurred.

Control register 44 preferably is twelve bits wide. Those bits preferably are used as follows:

One bit preferably indicates whether the power-up configuration is a user application configuration (in local update mode; power-up value="1") or the default configuration (in remote update mode; power-up value="0"). Another three bits preferably indicate the page address of the power-up configuration (power-up value preferably is "000" in remote update mode and "001" in local update mode). Preferably up to eight configurations may be stored, as discussed above, and therefore three bits are provided to allow indication of any one of those eight configurations, and these bits could be changed by the core logic as different configurations are selected. A fifth bit preferably indicates whether or not the watchdog timer is enabled (preferred power-up value="0"). The remaining twelve bits preferably are the settable bits of the watchdog timer initial value—i.e., the twelve high-order bits of the 29-bit initial counter value of the watchdog timer.

The contents of control register 44 can be written by the core logic of device 11 by shifting the appropriate data out through RU_DIN into shift register 41, whence they can be parallel loaded into register 43 and thence to register 44, under the control of logic 42 and logic 430. Similarly, control register 44 and status register 45 can read by the core logic by parallel loading their contents into shift register 41 and then reading them into RU_DOUT. Update register 43 contains the same data as control register 44, but can be read or written only by the default configuration in Remote Update mode.

Similarly, the seven core logic signals described above are enabled for both Remote Update mode and Local Update mode, and for both default and user application configurations, with two exceptions. First, RU_nRSTIMER is valid only for user application configurations in Remote Update mode, because only those configurations use a watchdog timer. The watchdog timer is disabled in Local Update mode, and for the default configuration in either mode.

Second, RU_CAPTnUPDT is enabled only for the default configuration in Remote Update mode, because that is the only case in which control register 44 can be written to by the core logic.

Figure 5:
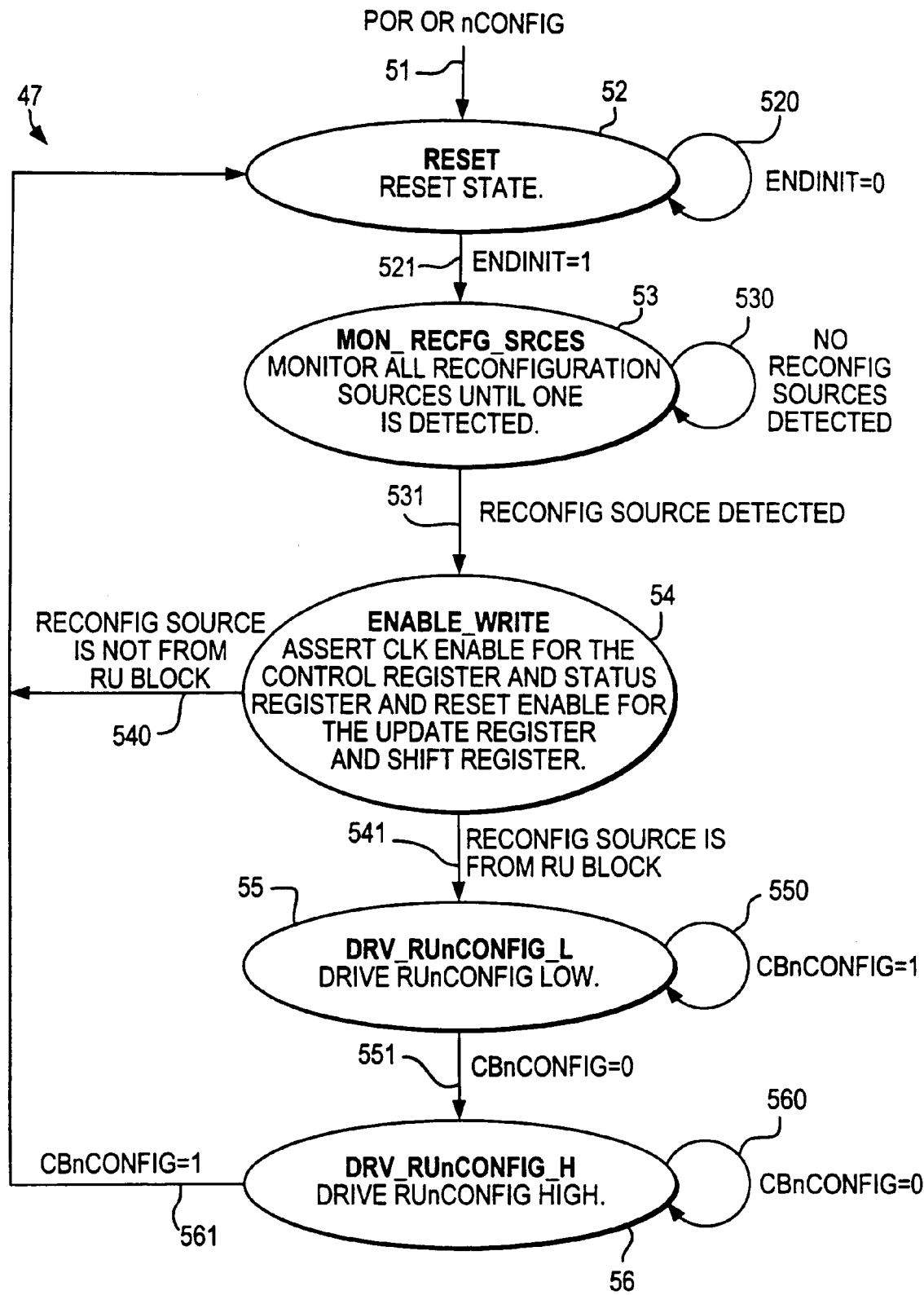
FIG. 5 is a schematic diagram of a preferred embodiment of a state machine governing a programmable logic system according to the present invention.

Remote Update State Machine 47 is diagramed in FIG. 5. On the occurrence of a power-up or reinitialization at 51, RUSM 47 enters RESET state 52, where it remains during the entire initialization period (indicated at 520 by ENDINIT=0). At the end of initialization at 521 (indicated by ENDINIT=1), RUSM 47 enters the MON_RECFG_SRCES state 53, and continually—i.e., on each cycle of the internal oscillator (preferably 10 MHZ as described above)—monitors all reconfiguration sources at 530, whether generated by the core logic or otherwise, and latches or stores them.

On occurrence of a reconfiguration source at 531, RUSM 47 enters ENABLE_WRITE state 54. In this state 54, the clock enable for control register 44 and status register 45 is enabled by RUSM 47, with the data being clocked in on the next rising edge of the internal oscillator. The data for status register 45 are the reconfiguration sources that were monitored and stored in state 53. The data for control register 44 are the contents of the update register 43, except in Local Update mode, where, if the reconfiguration is caused by control block 470 (CBnCONFIG) or core logic 11 (RU_n-CONFIG), then the bit that determines whether the configuration is the default configuration or a user application configuration, and the three bits that indicate the page location of the configuration to be loaded, are set to "1" and "001" respectively, regardless of the contents of update register 43.

Also in state 54, resetting of update register 43 and shift register 41 is enabled, and those registers are reset to zero synchronously, on the next positive edge of the internal oscillator.

After these actions are performed in state 54, RUSM 47 returns at 540 to reset state 52 if the reconfiguration source at 531 was not a Remote Update source (i.e., not an RU_nCONFIG or a user watchdog timeout), and otherwise proceeds at 541 to DRV_RUnCONFIG_L state 55.

In state 55, because the reconfiguration source is the Remote Update logic, the reconfiguration is triggered by asserting low the Remote Update nCONFIG signal (RU_n-CONFIG). RU_nCONFIG is held low at 550 until CBn-CONFIG, which lags RU_nCONFIG by two internal oscillator cycles, is observed low at 551, at which point RUSM 47 transitions to DRV_RU_nCONFIG_H state 56.

In state 56, once a reconfiguration has been triggered, RUnCONFIG can be, and is, driven high again to await the next reconfiguration event. Specifically, as long as CBn-CONFIG is observed at 560 to be low, meaning that reconfiguration is being triggered, RUSM 50 remains in state 56, forcing RUnCONFIG high. As soon as, at 561, CBnCON-FIG is observed to be high, meaning reconfiguration has been initiated, RUSM 50 returns to RESET state 52 to await the next reconfiguration event.

It should be clear from the foregoing that according to the present invention, reconfiguration of a programmable logic device can be controlled by the core logic of the device itself. Shift register 41 and update register 43 are controlled by core logic 11 directly. Control register 44 and status register 45 are controlled by Remote Update State Machine 47, but to the extent that core logic 11 can assert RU_n-CONFIG and affect RUSM 47, core logic 11 controls registers 44 and 45.

Figure 6:
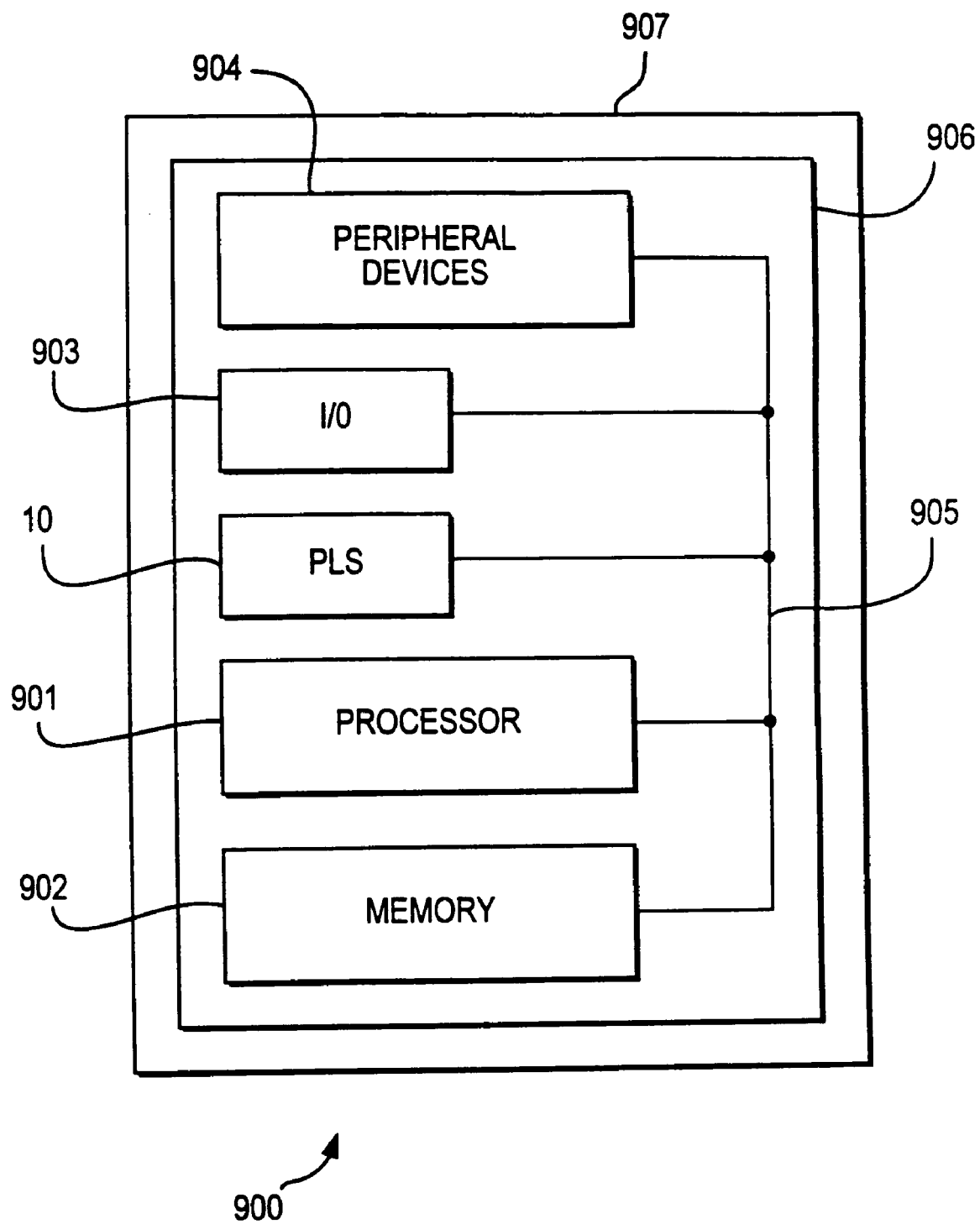
FIG. 6 is a simplified block diagram of an illustrative system employing a programmable logic system in accordance with the invention.

Programmable logic system (PLS) 10 incorporating an update feature as described above may be used as part of a data processing system 900 shown in FIG. 6. Data processing system 900 may include one or more of the following components: a processor 901; memory 902; I/O circuitry 903; and peripheral devices 904. These components are coupled together by a system bus 905 and are populated on a circuit board 906 which is contained in an end-user system 907.

System 900 can be used in a wide variety of applications, such as computer networking, data networking, instrumentation, video processing, digital signal processing, or any other application where the advantage of using programmable or reprogrammable logic is desirable. Programmable logic system 10 can be used to perform a variety of different logic functions. For example, programmable logic system 10 can be configured as a processor or controller that works in cooperation with processor 901. Programmable logic system 10 may also be used as an arbiter for arbitrating access to a shared resources in system 900. In yet another example, programmable logic system 10 can be configured as an interface between processor 901 and one of the other components in system 900. It should be noted that system 900 is only exemplary, and that the true scope and spirit of the invention should be indicated by the following claims.

Various technologies can be used to implement programmable logic systems 10 as described above according to this invention.

It will be understood that the foregoing is only illustrative of the principles of the invention, and that various modifications can be made by those skilled in the art without departing from the scope and spirit of the invention, and the present invention is limited only by the claims that follow.

What is claimed is:

1. A programmable logic system comprising:
   a programmable logic device adapted to be configured by loading a stored configuration; and
   a configuration storage device adapted to store a plurality of configurations; wherein:
   a first one of said plurality of configurations is a default configuration;
   said programmable logic device includes configuration circuitry that initiates loading of one of said plurality of configurations, other than said default configuration, from said configuration storage device; and
   on occurrence of a configuration failure during or after loading of said one of said plurality of configurations other than said default configuration, said configuration circuitry initiates recovery loading of said default configuration.

2. The programmable logic system of claim 1 wherein:
   said configuration storage device is a memory; and
   said configuration circuitry includes address generation circuitry for addressing data in said memory during configuration loading.

3. The programmable logic system of claim 2 wherein said memory is a flash memory.

4. The programmable logic system of claim 2 wherein said address generation circuitry is in said configuration storage device.

5. The programmable logic system of claim 2 wherein said address generation circuitry is in said programmable logic device.

6. The programmable logic system of claim 2 wherein said address generation circuitry is outside said configuration storage device and said programmable logic device.

7. The programmable logic system of claim 1 wherein said configuration storage device comprises:
   a memory; and address generation circuitry for addressing data in said memory during configuration loading.

8. The programmable logic system of claim 7 wherein said memory is a flash memory.

9. The programmable logic system of claim 1 wherein:
said configuration storage device comprises a memory; and
said programmable logic device comprises address generation circuitry for addressing data in said memory during configuration loading.

10. The programmable logic system of claim 9 wherein said memory is a flash memory.

11. The programmable logic system of claim 1 wherein:
said configuration storage device comprises a memory;
said programmable logic system further comprising:
address generation circuitry for addressing data in said memory during configuration loading.

12. The programmable logic system of claim 11 wherein said memory is a flash memory.

13. The programmable logic system of claim 1 wherein:
said configuration circuitry initiates loading of one of said plurality of configurations by initiating a first loading of said default configuration;
said programmable logic device as configured by said default configuration initiates loading of an initial configuration other than said default configuration;
said programmable logic system further comprises an exception storage; and
on said occurrence of said configuration failure, said configuration circuitry stores, in said exception storage, data regarding said configuration failure, for use by said programmable logic device as configured by said default configuration after said recovery loading of said default configuration.

14. The programmable logic system of claim 13 wherein:
one of said plurality of configurations other than said default configuration is a primary configuration; and
said initial configuration is said primary configuration.

15. The programmable logic system of claim 14 wherein:
upon loading of said default configuration, said programmable logic device as configured by said default configuration examines said exception storage to determine whether loading of said default configuration is said first loading or said recovery loading; and
when loading of said default configuration is said recovery loading, said programmable logic device as configured by said default configuration executes a recovery routine.

16. The programmable logic system of claim 15 wherein said recovery routine comprises signalling for operator intervention.

17. The programmable logic system of claim 15 wherein said recovery routine comprises loading one of said plurality of configurations other than said default configuration and other than said primary configuration.

18. The programmable logic system of claim 17 wherein:
at least each configuration other than said default configuration in said configuration storage device bears an indicium indicating its age; and
said loading one of said plurality of configurations other than said default configuration and other than said primary configuration comprises loading one of said plurality of configurations, other than said default configuration and said primary configuration, whose indicium is most recent.

19. The programmable logic system of claim 18 wherein said indicium is a time stamp.

20. The programmable logic system of claim 18 wherein said indicium is a serial number.

21. The programmable logic system of claim 18 wherein:
on failure of a configuration other than said default configuration, said recovery routine comprises loading another one of said plurality of configurations whose indicium is next most recent.

22. The programmable logic system of claim 13 wherein:
upon loading of said default configuration, said programmable logic device as configured by said default configuration examines said exception storage to determine whether loading of said default configuration is said first loading or said recovery loading; and
when loading of said default configuration is said recovery loading, said programmable logic device as configured by said default configuration executes a recovery routine.

23. The programmable logic system of claim 22 wherein said recovery routine comprises signalling for operator intervention.

24. The programmable logic system of claim 22 wherein said recovery routine comprises loading one of said plurality of configurations other than said default configuration and said initial configuration.

25. The programmable logic system of claim 24 wherein:
at least each configuration other than said default configuration in said configuration storage device bears an indicium indicating its age; and
said loading one of said plurality of configurations other than said default configuration comprises loading one of said plurality of configurations, other than said default configuration and said initial configuration, whose indicium is most recent.

26. The programmable logic system of claim 25 wherein said indicium is a time stamp.

27. The programmable logic system of claim 25 wherein said indicium is a serial number.

28. The programmable logic system of claim 25 wherein:
on failure of a configuration other than said default configuration and other than said initial configuration, said recovery routine comprises loading another one of said plurality of configurations whose indicium is next most recent.

29. The programmable logic system of claim 13 further comprising a watchdog timer; wherein:
said default configuration initiates said watchdog timer prior to said loading of said initial configuration;
said initial configuration is adapted to cause resetting of said watchdog timer under normal conditions; and
said configuration failure is a failure of said initial configuration to cause said resetting of said watchdog timer.

30. The programmable logic system of claim 1 further comprising a watchdog timer; wherein:
at least one of said configurations is adapted to cause resetting of said watchdog timer under normal conditions; and
said configuration failure is a failure of said at least one of said configurations to cause said resetting of said watchdog timer.

31. The programmable logic system of claim 1 wherein:
said configuration circuitry initiates loading of one of said plurality of configurations by initiating loading of an initial one of said plurality of configurations other than said default configuration;
said programmable logic system further comprises an exception storage; and on said occurrence of said configuration failure, said configuration circuitry stores, in said exception storage, data regarding said configuration failure, for use by said default configuration after said recovery loading of said default configuration.

32. The programmable logic system of claim 31 wherein:
one of said plurality of configurations other than said default configuration is a primary configuration; and
said initial configuration is said primary configuration.

33. The programmable logic system of claim 32 wherein:
upon loading of said default configuration, said programmable logic device as configured by said default configuration examines said exception storage to determine whether loading of said default configuration is said recovery loading; and
when loading of said default configuration is said recovery loading, said programmable logic device as configured by said default configuration executes a recovery routine.

34. The programmable logic system of claim 33 wherein said recovery routine comprises signalling for operator intervention.

35. The programmable logic system of claim 33 wherein said recovery routine comprises loading one of said plurality of configurations other than said default configuration and other than said primary configuration.

36. The programmable logic system of claim 35 wherein:
at least each configuration other than said default configuration in said configuration storage device bears an indicium indicating its age; and
said loading one of said plurality of configurations other than said default configuration and other than said primary configuration comprises loading one of said plurality of configurations, other than said default configuration and said primary configuration, whose indicium is most recent.

37. The programmable logic system of claim 36 wherein said indicium is a time stamp.

38. The programmable logic system of claim 36 wherein said indicium is a serial number.

39. The programmable logic system of claim 36 wherein:
on failure of a configuration other than said default configuration, said recovery routine comprises loading another one of said plurality of configurations whose indicium is next most recent.

40. The programmable logic system of claim 31 wherein:
upon loading of said default configuration, said programmable logic device as configured by said default configuration examines said exception storage to determine whether loading of said default configuration is said first loading or said recovery loading; and
when loading of said default configuration is said recovery loading, said programmable logic device as configured by said default configuration executes a recovery routine.

41. The programmable logic system of claim 40 wherein said recovery routine comprises signalling for operator intervention.

42. The programmable logic system of claim 40 wherein said recovery routine comprises loading one of said plurality of configurations other than said default configuration and said initial configuration.

43. The programmable logic system of claim 42 wherein:
at least each configuration other than said default configuration in said configuration storage device bears an indicium indicating its age; and
said loading one of said plurality of configurations other than said default configuration comprises loading one of said plurality of configurations, other than said default configuration and said initial configuration, whose indicium is most recent.

44. The programmable logic system of claim 43 wherein said indicium is a time stamp.

45. The programmable logic system of claim 43 wherein said indicium is a serial number.

46. The programmable logic system of claim 43 wherein:
on failure of a configuration other than said default configuration and other than said initial configuration, said recovery routine comprises loading another one of said plurality of configurations whose indicium is next most recent.

47. A digital processing system comprising:
processing circuitry;
a memory coupled to said processing circuitry; and
a programmable logic system as defined in claim 1 coupled to the processing circuitry and the memory.

48. A printed circuit board on which is mounted a programmable logic system as defined in claim 1.

49. The printed circuit board defined in claim 48 further comprising:
memory circuitry mounted on the printed circuit board and coupled to the programmable logic system.

50. The printed circuit board defined in claim 49 further comprising:
processing circuitry mounted on the printed circuit board and coupled to the memory circuitry.

51. A digital processing system comprising:
processing circuitry;
a memory coupled to said processing circuitry; and
a programmable logic system as defined in claim 13 coupled to the processing circuitry and the memory.

52. A printed circuit board on which is mounted a programmable logic system as defined in claim 13.

53. The printed circuit board defined in claim 52 further comprising:
memory circuitry mounted on the printed circuit board and coupled to the programmable logic device.

54. The printed circuit board defined in claim 53 further comprising:
processing circuitry mounted on the printed circuit board and coupled to the memory circuitry.

55. A digital processing system comprising:
processing circuitry;
a memory coupled to said processing circuitry; and
a programmable logic system as defined in claim 31 coupled to the processing circuitry and the memory.

56. A printed circuit board on which is mounted a programmable logic device as defined in claim 31.

57. The printed circuit board defined in claim 56 further comprising:
memory circuitry mounted on the printed circuit board and coupled to the programmable logic device.

58. The printed circuit board defined in claim 57 further comprising:
processing circuitry mounted on the printed circuit board and coupled to the memory circuitry.

* * * * *